United States Patent
Liu et al.

(10) Patent No.: US 8,704,375 B2
(45) Date of Patent: Apr. 22, 2014

(54) BARRIER STRUCTURES AND METHODS FOR THROUGH SUBSTRATE VIAS

(75) Inventors: Max Liu, Jhubei (TW); Chao-Shun Hsu, San Shin (TW); Ya-Wen Tseng, Hsin-Chu (TW); Wen-Chih Chiou, Miaoli (TW); Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 571 days.

(21) Appl. No.: 12/613,417

(22) Filed: Nov. 5, 2009

(65) Prior Publication Data

US 2010/0193954 A1   Aug. 5, 2010

Related U.S. Application Data

(60) Provisional application No. 61/149,906, filed on Feb. 4, 2009.

(51) Int. Cl.
| | |
|---|---|
| *H01L 23/48* | (2006.01) |
| *H01L 29/417* | (2006.01) |
| *H01L 23/498* | (2006.01) |
| *H01L 21/768* | (2006.01) |

(52) U.S. Cl.
CPC ... *H01L 29/4175* (2013.01); *H01L 2225/06541* (2013.01); *H01L 23/49822* (2013.01); *H01L 21/76898* (2013.01)
USPC ............ 257/774; 257/E23.174; 257/E21.577; 257/E21.585; 257/E21.597; 438/667

(58) Field of Classification Search
USPC .......... 438/637, 639, 672, 675, 667; 257/178, 257/669, E23.011, E23.174, 774, E23.067, 257/E21.577, E21.585, 621, 751, E21.597
See application file for complete search history.

(56) References Cited

U.S. PATENT DOCUMENTS

| | | | |
|---|---|---|---|
| 5,391,917 | A | 2/1995 | Gilmour et al. |
| 5,424,245 | A | 6/1995 | Gurtler et al. |
| 5,493,096 | A | 2/1996 | Koh |
| 5,510,298 | A | 4/1996 | Redwine |
| 5,767,001 | A | 6/1998 | Bertagnolli et al. |
| 5,789,316 | A | 8/1998 | Lu |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |

(Continued)

FOREIGN PATENT DOCUMENTS

| | | |
|---|---|---|
| JP | 07-162055 | 6/1995 |

*Primary Examiner* — Ha Tran T Nguyen
*Assistant Examiner* — Suberr Chi
(74) *Attorney, Agent, or Firm* — Slater & Matsil, L.L.P.

(57) ABSTRACT

Through substrate via barrier structures and methods are disclosed. In one embodiment, a semiconductor device includes a first substrate including an active device region disposed within isolation regions. A through substrate via is disposed adjacent to the active device region and within the first substrate. A buffer layer is disposed around at least a portion of the through substrate via, wherein the buffer layer is disposed between the isolation regions and the through substrate via.

20 Claims, 13 Drawing Sheets

(56) References Cited

U.S. PATENT DOCUMENTS

| | | |
|---|---|---|
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,372 B1 * | 1/2007 | Trezza ............ 438/675 |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,317,256 B2 | 1/2008 | Williams et al. |
| 7,335,972 B2 | 2/2008 | Chanchani |
| 7,355,273 B2 | 4/2008 | Jackson et al. |
| 7,985,655 B2 * | 7/2011 | Smith ............ 438/424 |
| 2005/0253265 A1 * | 11/2005 | Barkyoumb et al. ...... 257/751 |
| 2008/0079121 A1 | 4/2008 | Han |
| 2008/0142990 A1 | 6/2008 | Yu et al. |
| 2008/0283959 A1 * | 11/2008 | Chen et al. ............ 257/508 |
| 2009/0224357 A1 * | 9/2009 | Juengling ............ 257/506 |

* cited by examiner

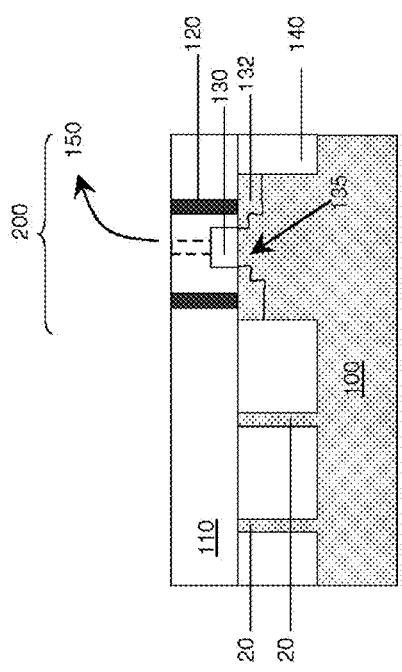
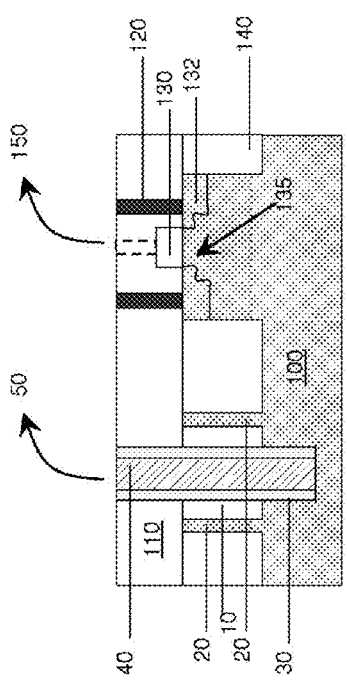

BARRIER STRUCTURES AND METHODS FOR THROUGH SUBSTRATE VIAS

This application claims the benefit of U.S. Provisional Application No. 61/149,906 filed on Feb. 4, 2009, entitled "Barrier Structures and Methods for Through Substrate Vias," which application is hereby incorporated herein by reference.

TECHNICAL FIELD

The present invention relates generally to through substrate via structures and methods, and more particularly to barrier structures and methods for through substrate vias.

BACKGROUND

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices generally should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through-vias. Through-vias extend through the substrate thereby electrically interconnecting circuits on various chips stacked together. Through-via interconnections can provide advantages in terms of interconnect density compared to other technologies. However, introduction of such interconnects may introduce additional challenges.

The integration of chips in 3D brings forth new challenges that should be addressed. One of the challenges arises due to deleterious effects that through substrate vias may produce on active devices. One such effect arises due to the strain that may result from the formation of the through substrate vias. The strain from these through substrate vias may cause significant variation as well as systematic degradation of devices within the active circuitry. This problem is amplified as the number of through substrate vias is increased to increase integration of the stacked chips. Hence, what is needed in the art are improved structures and methods of producing through substrate vias without significantly impacting devices or components fabricated on the chips.

SUMMARY OF THE INVENTION

These and other problems are generally solved or circumvented, and technical advantages are generally achieved, by preferred embodiments of the present invention.

Embodiments of the invention include barrier structures for through substrate vias. In accordance with an embodiment of the present invention, a semiconductor device comprises an active device region disposed within isolation regions in a first substrate. A through substrate via is disposed adjacent to the active device region. A buffer layer is disposed around at least a portion of the through substrate via, wherein the buffer layer is disposed between the isolation regions and the through substrate via.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, illustrates an embodiment of a through substrate via in accordance with an embodiment of the invention, wherein FIG. 1a illustrates a cross sectional view and FIG. 1b illustrates a top view;

FIG. 2, which includes

FIG. 3, which includes FIGS. 3a-3d, illustrates an embodiment of a through substrate via in accordance with embodiments of the invention, wherein FIGS. 3a and FIG. 3c illustrate cross sectional views and FIGS. 3b and 3d illustrate corresponding top views;

FIG. 4, which includes FIGS. 4a and 4b, illustrates an embodiment of a through substrate via in accordance with an embodiment of the invention, wherein FIG. 4a illustrates a cross sectional view and FIG. 4b illustrates a top view;

FIG. 5, which includes FIGS. 5a and 5b, illustrates an embodiment of a through substrate via in accordance with an embodiment of the invention, wherein FIG. 5a illustrates a cross sectional view and FIG. 5b illustrates a top view;

FIG. 6, which includes

FIG. 7, which includes FIGS. 7a-7e, illustrates a semiconductor device in various stages of fabrication, in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely through substrate vias. The invention may also be applied, however, to prevent transmission of stress from other types of structures within integrated circuits.

Through substrate vias generally introduce large amounts of stress during and subsequent to processing. The large stress fields around the through substrate vias arise during unit processes in the fabrication of these vias, for example, etching or deposition. Further stress may build up during chip fabrication after forming the through substrate vias. For example, thermal cycling during formation of upper metal levels may result in increased stress built up due to thermal expansion effects. The stress fields from these through substrate vias can decay over large distances impacting transistors in the chip.

The first order impact of stress on transistor performance is well documented. For example, it is well known in the art for transistors disposed on a (100) silicon substrate with channel orientations along <110> directions, a lateral tensile stress improves electron mobility (or improves n-channel transistors), but degrades hole mobility (or p-channel transistors). Similarly, a vertical compressive stress improves electrode mobility, while degrading hole mobility. The nature of the enhancement or degradation depends on the channel orientation and crystal surface of the substrate material. Consequently while stress effects can be leveraged to improve device performance, variations in stress can result in significant variation in performance of transistors. For example, a decrease in the stress in the channel may degrade device performance, while an increase in stress in the channel may nucleate defects within the channel.

Various embodiments of the invention generally avoid the degradation or variation in transistor performance arising from stress fields from through substrate vias by the formation of stress buffer structures that reduce the stress transferred into the active regions of the chips.

A structural embodiment of the invention will be described using FIG. 1. The operating of the stress buffer structure using various embodiments of the invention will be described using FIG. 2. Further structural embodiments will be described using FIGS. 3-5. Subsequently, methods of fabricating a buffer structure for a through substrate via will be described using FIGS. 6 and 7. FIG. 8 illustrates using embodiments of the invention to form stacked chips.

Figure 1B:
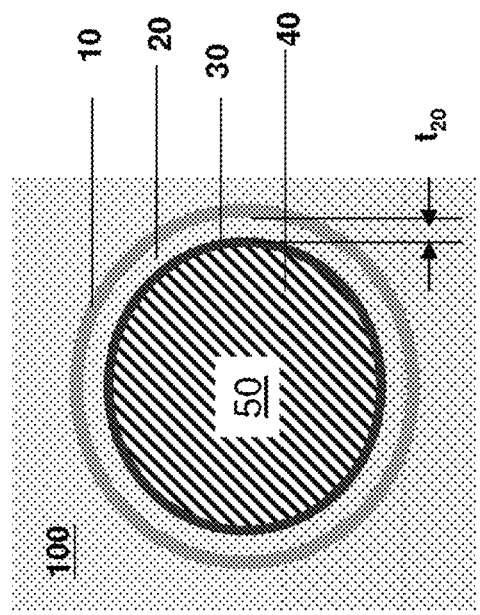
Figure 1A:
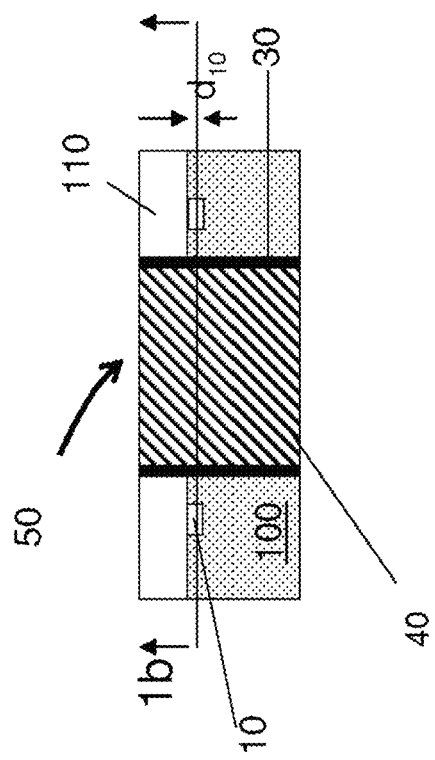

FIG. 1, which includes FIGS. 1a and 1b, illustrates a through substrate via along with a stress buffer structure in accordance with an embodiment of the invention. FIG. 1a illustrates a cross sectional view, while FIG. 1b illustrates a top view of the through substrate via.

Referring to FIGS. 1a and 1b, the through substrate via 50 is disposed in a substrate 100. The substrate 100 comprises a semiconductor material region, for example, a diced wafer in one embodiment. In various embodiments, the substrate 100 is doped with an n-type conductivity or p-type conductivity. Some examples of the substrate 100 are a bulk mono-crystalline silicon substrate (or a layer grown thereon or otherwise formed therein), and a layer of a silicon-on-insulator (SOI) wafer. In other embodiments, compound semiconductors can be used with the wafer.

The through substrate via 50 comprises a conductive material 40, and is lined by a through substrate via liner 30. The conductive material 40 comprises a conductive or heavily doped semiconductive material. In one embodiment, the conductive material 40 comprises metallic materials, for example, copper, aluminum, silicides. In other embodiments, the conductive material 40 comprises doped polysilicon.

The through substrate via liner 30 comprises a diffusion barrier material such as TaN or TiN. In some embodiments, the through substrate via liner 30 also comprises an insulating liner. Examples of an insulating liner include silicon oxide, silicon nitride, silicon oxynitride, or other low-k or high-k dielectric materials.

In one embodiment, the through substrate via 50 is surrounded at least partially by a buffer structure 20. In various embodiments, the buffer structure 20 comprises silicon or a material that is the same as the material of the substrate 100. In one embodiment, the thickness $t_{20}$ of the buffer structure 20 is adjusted to compensate the strain arising from the conductive material 40. In various embodiments, the thickness $t_{20}$ of the buffer structure 20 is at least greater than 1% of the diameter or width of the through substrate via 50. In this embodiment the buffer structure 20 is disposed on the through substrate via 50, although in other embodiments, intermediate layers may be disposed between the through substrate via 50 and the buffer structure 20.

A stress barrier structure 10 is disposed around the buffer structure 20. In various embodiments, the stress barrier structure 10 comprises an insulating material layer. In one embodiment, the stress barrier structure 10 comprises an oxide or a nitride material layer. In various embodiments, the stress barrier structure 10 comprises a depth $d_{10}$ of about 200 nm to about 800 nm. In one embodiment, the depth $d_{10}$ of the stress barrier structure 10 is about 300 nm. In various embodiments, the stress barrier structure 10 comprises a material with a modulus of elasticity (for example, Young's modulus) smaller than a material of the buffer structure 20. In one embodiment, the modulus of elasticity of the stress barrier structure 10 is less than 75% of the modulus of elasticity of the buffer structure 20.

In some embodiments, a first insulating layer 110 is disposed over the substrate 100. In one embodiment, the first insulating layer 110 comprises an inter level dielectric layer. In various embodiments, the first insulating layer 110 comprises an oxide, a nitride, or a suitable low-k material layer such as fluorinated silicate glass, carbon doped glass, organo silicate glass, hydrogen doped glass, porous carbon doped glass, porous silicon dioxide.

The through substrate via 50 extends from the bottom surface of the substrate 100 through the top surface of the substrate 100, and to a pad formed on the first insulating layer 110. In various embodiments, further metal levels are formed above the first insulating layer 110. In some embodiments, the through substrate via 50 extends to an upper metallization, and a last metal level is formed above the through substrate via 50.

Figure 2A:
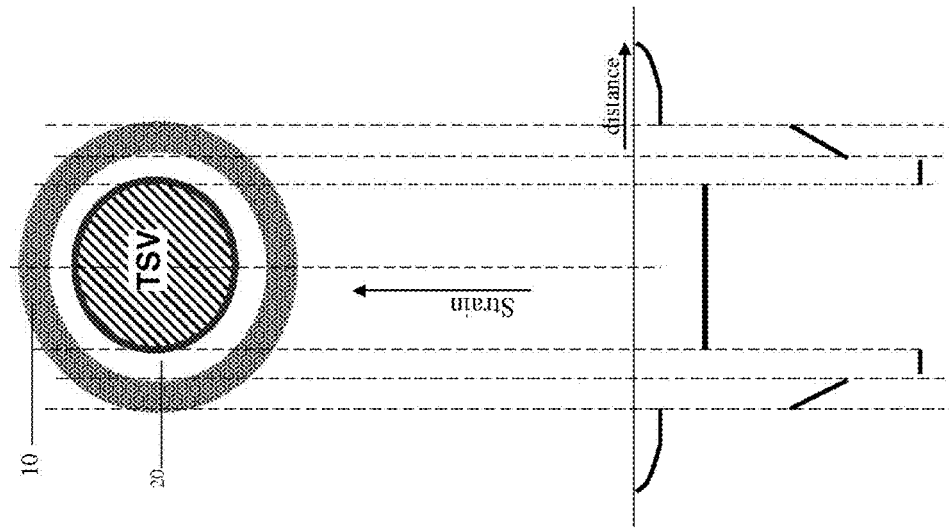
FIGS. 2a and 2b, illustrates the dissipation of the strain energy from the through substrate via in accordance with embodiments of the invention.
Figure 2B:
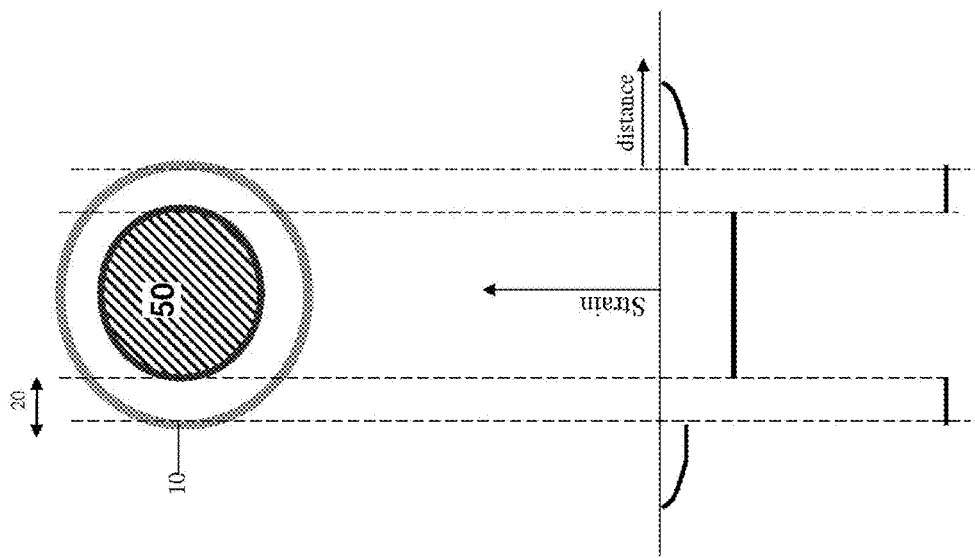

FIG. 2, which includes FIGS. 2a and 2b, illustrates the stress relaxation around the through substrate via in accordance with embodiments of the invention.

Referring to the top portion of the FIG. 2a, a through substrate via 50 is illustrated surrounded by a buffer structure 20 and a further stress barrier structure 10 (for example as described in FIG. 1). If the through substrate via 50 is under compressive strain, the through substrate via 50 exerts a compressive strain on the surrounding structures. In the absence of the buffer structure 20, this compressive strain decays over a substantial distance and may negatively impacts the performance of adjacent transistors. However, if the strain is forced to be accommodated within the buffer structure 20, the strain in the channel of an adjacent transistor is significantly reduced. In various embodiments, the combination of the buffer structure 20 and the stress barrier structure 10 results in the substantial relaxation of strain from the through substrate via within the buffer structure 20. In one embodiment, at least 50% of the strain from the through substrate via 50 is relaxed over the buffer structure 20. For example, a through substrate via 50 is formed within an opening with a diameter of about 5 um. Assuming no strain before the formation of the through substrate via 50, and if the through substrate via expands by about 0.1%, a 500 nm buffer structure 20 under a 1% compressive strain generally will completely relax all the strain from the through substrate via 50. Hence, for a given diameter of the through substrate via 50 (hence for a given strain), the thicknesses of the buffer structure 20 and the stress barrier structure 10 may be adjusted.

In various embodiments, the materials of the buffer structure 20 and the stress barrier structure 10 are selected to maximize this strain relaxation effect. For example, the stress barrier structure 10 comprises a material that is of a lower modulus of elasticity than the material of the buffer structure 20. Further, formation of defects may accommodate a higher level of strain from the through substrate via 50. Hence, in some embodiments, the formation of crystal defects within the buffer structure 20 may be induced.

FIG. 2b illustrates an alternative embodiment, wherein the strain from the through substrate via 50 is accommodated partially through the buffer structure 20 and then the stress barrier structure 10.

Figure 3B:
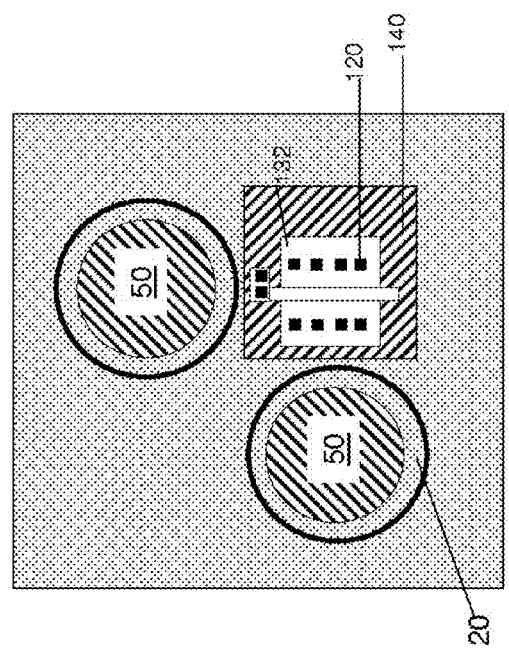
Figure 3A:
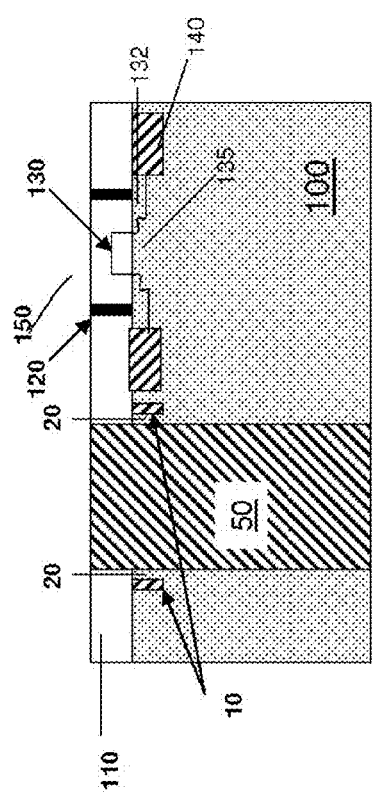
Figure 3D:
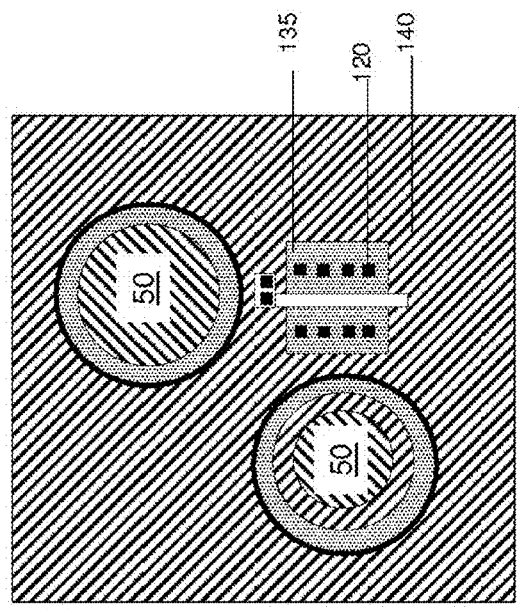
Figure 3C:
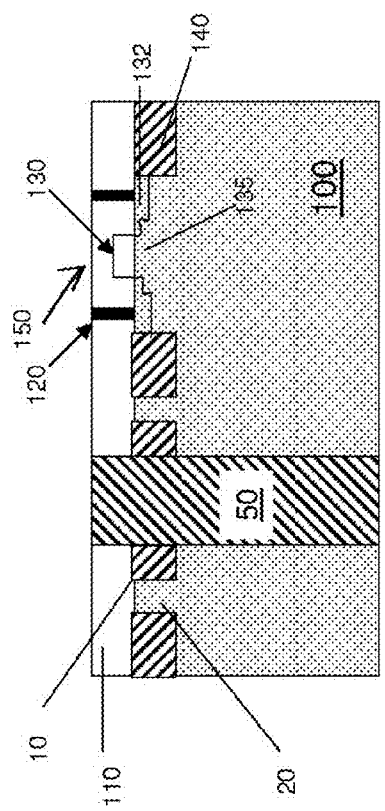

FIG. 3, which includes FIGS. 3a-3d, illustrates a through substrate via 50 surrounded by a buffer structure 20 and being disposed adjacent to a transistor, in accordance with an embodiment of the invention. FIG. 3a illustrates a cross sectional view and FIG. 3b illustrates a top view for a first embodiment, and wherein FIG. 3c illustrates a cross sectional view and FIG. 3d illustrates a top view for a second embodiment Referring to FIGS. 3a and 3b, the through substrate via 50 is disposed adjacent a transistor 150. As in prior embodiments, the through substrate via 50 is surrounded by a buffer structure 20 and a stress barrier structure 10. In various embodiments, the buffer structure 20 is disposed between the through substrate via 50 and the transistor 150.

A first insulating layer 110 is disposed over the substrate 100. In one embodiment, the first insulating layer 110 comprises an inter level dielectric layer. In various embodiments, the first insulating layer 110 comprises an oxide, a nitride, or a suitable low-k material layer such as fluorinated silicate glass, carbon doped glass, organo silicate glass, hydrogen doped glass, porous carbon doped glass, porous silicon dioxide.

A transistor 150 is disposed within the substrate 100 adjacent to the through substrate via 50. Isolation regions 140 electrically isolate the transistor 150 from adjacent transistors or devices. The transistor 150 comprises a channel 135 disposed between source/drain regions 132. A gate electrode 130 is disposed above the channel 135. The source/drain regions 132 and the gate electrode 130 are coupled through the contact plugs 120 to upper metallization levels (not shown). Contact plugs 120 are formed within the first insulating layer 110 and couple to active devices such as the transistor 150.

As in prior embodiments, a buffer structure 20 is disposed around the through substrate via 50, and a stress barrier structure 10 is disposed on the buffer structure 20. The thickness of the stress barrier structure 10 and the buffer structure 20 are selected to minimize the stress in the channel 135 of the transistor 150. In various embodiments, the stress from the through substrate via 50 is substantially accommodated or relaxed within the buffer structure 20. By using a separate stress barrier structure 10 disposed within the substrate 100, the material property of the stress barrier structure 10 may be independently varied in some embodiments. For example, in one embodiment, the stress barrier structure 10 may comprise a material that has a modulus of elasticity less than the modulus of elasticity of the isolation regions 140. More stress arising from the through substrate via 50 within the buffer structure 20 may thus be accommodated.

Referring to FIGS. 3c and 3d, the through substrate via 50 is disposed adjacent a transistor 150. As in prior embodiments, the through substrate via 50 is surrounded by a buffer structure 20 and a stress barrier structure 10. As in prior embodiments, the buffer structure 20 is disposed between the through substrate via 50 and the transistor 150. Unlike the prior embodiment illustrated in FIGS. 3a and 3b, in this embodiment, the buffer structure 20 is disposed on the stress barrier structure 10 surrounding the through substrate via 50.

The thickness of the buffer structure 20 is selected to minimize the stress in the channel 135 of the transistor 150. In various embodiments, the stress from the through substrate via 50 is substantially accommodated or relaxed within the buffer structure 20.

Figure 4B:
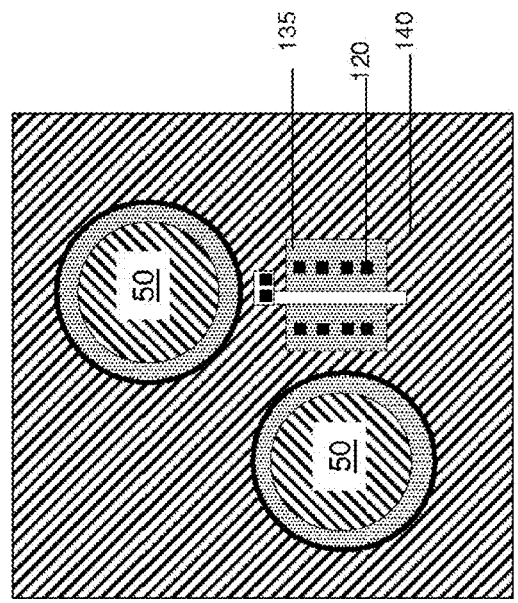
Figure 4A:
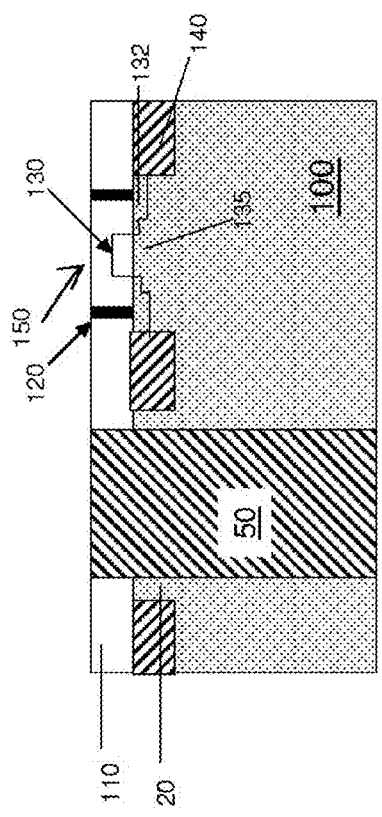

FIG. 4, which includes FIGS. 4a and 4b, illustrates an alternative embodiment in which the transistor 150 is disposed adjacent a through substrate via 50, wherein FIG. 4a illustrates a cross sectional view and FIG. 4b illustrates a top view.

Referring to FIGS. 4a and 4b, the active regions of the transistor 150 are formed within the isolation regions 140. The isolation regions 140 are separated from the through substrate via 50 by a buffer structure 20. The buffer structure 20 is disposed around the through substrate via 50, and helps to relax the stress arising from the through substrate via 50. In various embodiments, the thickness of the buffer structure 20 is selected such that the buffer structure 20 accommodates a substantial part of the strain from the through substrate via 50.

Figure 5B:
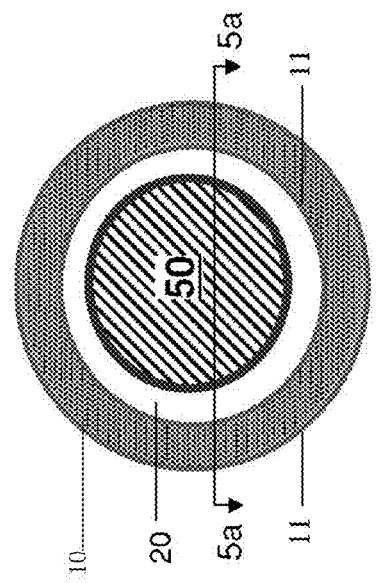
Figure 5A:
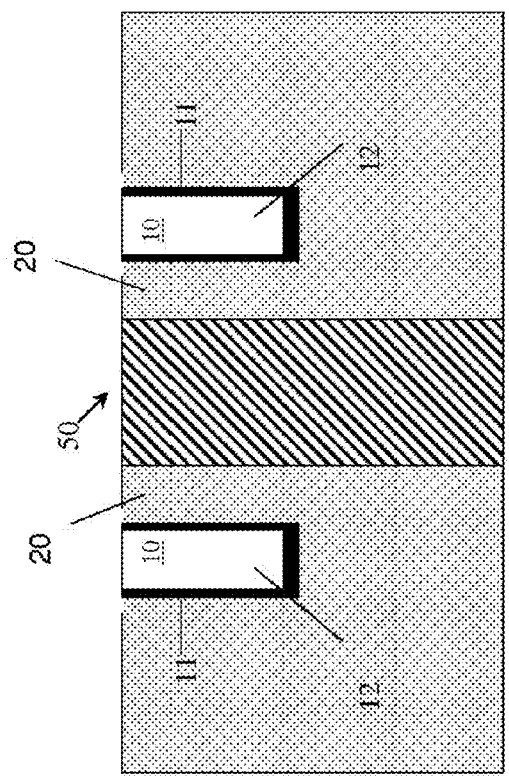

FIG. 5, which includes FIGS. 5a and 5b, illustrates an embodiment in which a stress barrier structure comprises multiple material layers. FIG. 5a illustrates a cross sectional view and FIG. 5b illustrates a top view.

As in prior embodiments, the buffer structure 20 is disposed around a through substrate via 50, and a stress barrier structure 10 is formed around the buffer structure 20. Referring to FIG. 5a, the stress buffer structure 10 comprises a first material 11 and a second material 12. In one embodiment, the first material 11 is formed as a liner and a second material 12 is formed a filler material. In one embodiment, the first material 11 comprises a nitride, and the second material 12 comprises an oxide, for example, an oxide deposited using high density plasma process.

FIG. 6, which includes FIGS. 6a-6h, illustrates a method of fabrication of a through substrate via surrounded by the stress relaxation layers in accordance with embodiments of the invention.

The front end processing of the substrate 100 is first performed. The front end processing includes the formation of device regions 200 as well as isolation regions 140. At this stage of processing, the substrate 100 is typically a semiconductor wafer.

Figure 6A:
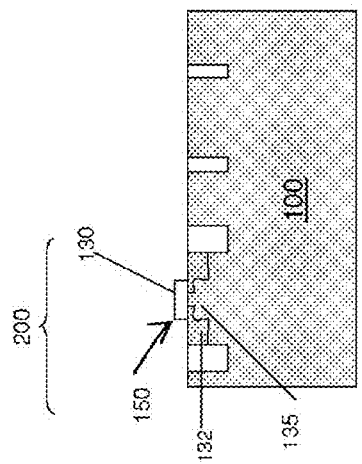
FIGS. 6a-6h, illustrates a semiconductor device in various stages of fabrication, in accordance with an embodiment of the invention.

Referring to FIG. 6a, isolation regions 140 and stress barrier structure 10 are formed within the substrate 100. The isolation regions 140 define active areas in which integrated circuit components are formed. Conventional techniques may be used to form the isolation regions 140 and stress barrier structure 10. For example, a hard mask layer (not shown here), such as silicon nitride, can be formed over the substrate 100 and patterned to expose the isolation areas and areas that form the stress barrier structure 10. The exposed portions of the substrate 100 can then be etched to the appropriate depth, for example, between about 200 nm and about 400 nm, thus forming trenches.

The isolation regions 140 and the stress barrier structure 10 are formed by filling the trenches with an isolating material.

For example, exposed silicon surfaces can be thermally oxidized to form a thin oxide layer. In some embodiments, the trenches are lined with a first material such as a nitride layer (e.g., $Si_3N_4$). The trenches are then be filled with a second material, such as an oxide. For example, in some embodiments, a high density plasma (HDP) is performed filling the trenches with a HDP oxide. In other embodiments, other trench filling processes can be used.

In various embodiments, stress barrier structure 10 and isolation regions 140 share common mask, etch and filling processes, thus advantageously minimizing the cost of adding the stress barrier structure 10.

Figure 6B:
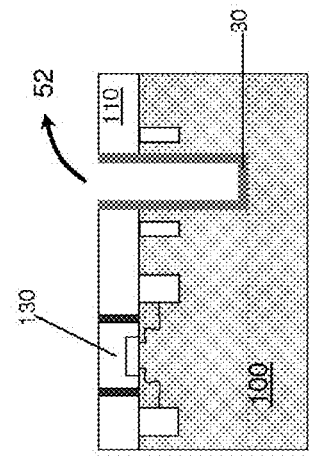

Referring to FIG. 6b, device regions 200 are formed on a side near a top surface of a substrate 100 during front end processing. The device regions 200 include transistors, resistors, capacitors, inductors or other components used to form the active devices. Formation of device regions 200 includes the formation of a gate stack comprising gate dielectrics, gate electrodes, and formation of source/drain, source/drain extensions, and silicide regions.

As illustrated in FIG. 6b, a transistor 150 is formed within the device regions 200. A gate stack comprising a gate electrode 130 and a gate dielectric (not shown) are formed over the substrate 100. In various embodiments, the gate dielectric is deposited over the substrate 100. In one embodiment, the gate dielectric comprises an oxide (e.g., $SiO_2$), a nitride (e.g., $Si_3N_4$), a combination of oxide and nitride (e.g., SiON, or an oxide-nitride-oxide sequence), or high k materials. The gate electrode 130 is formed over the gate dielectric. The gate electrode 130 preferably comprises a semiconductor material, such as polysilicon, or a metallic material, such as a metallic nitride. Source/drain regions 132 are formed adjacent to the gate electrode 130, the source/drain regions 132 being spaced by suitable spacers (not shown). In various embodiments, the source/drain regions 132 are formed by implantation and annealing.

A channel 135 is thus formed under the gate electrode 130. The channel 135 comprises an opposite conductivity to the source/drain regions 132. Thus, the transistor 150 comprises the gate electrode 130, the channel 135, the source/drain regions 132, and isolated by the isolation regions 140. A silicide layer is formed on the top surface of the source/drain regions 132 to minimize contact resistance between the device regions 200 and the interconnect metallization to follow.

Figure 6C:
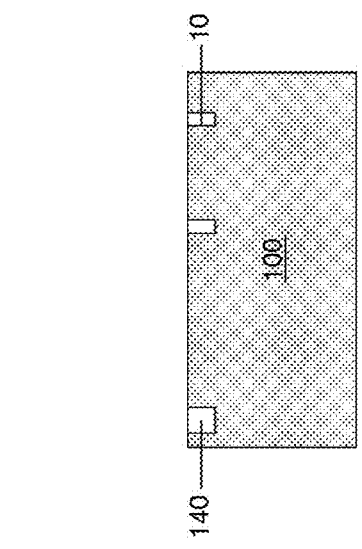

Referring to FIG. 6c, a first insulating layer 110 is deposited over the device regions 200. The first insulating layer 110 comprises materials such as doped glass (BPSG, PSG, BSG), organo silicate glass (OSG), fluorinated silicate glass (FSG), spun-on-glass (SOG), silicon nitride, and plasma enhanced tetraethyloxysilane (TEOS), as examples. The first insulating layer 110 may comprise multiple layers. For example, in one embodiment, the first insulating layer 110 comprises a nitride layer with an oxide layer disposed over the nitride layer.

The contact plugs 120 are formed within the first insulating layer 110, the contact plugs 120 coupling the device regions 200 to upper metallization levels. In regions where the contact plugs 120 are to be made, the insulating layer 110 is etched down to substrate 100 (for example, the silicide regions) thus forming contact plug holes. In one embodiment, a photoresist (not shown) is deposited and patterned to mask off the non-exposed regions to a subsequent etching step. The first insulating layer 110 is then etched down to the substrate 100 using standard etch techniques. Once the etch is complete, the photoresist may be removed. Any exposed first insulating layer 110 is etched off exposing the substrate 100.

The contact plugs 120 are formed by a deposition of first conductive material. A conductive liner may be deposited prior to filling the contact plug hole with a first conductive material. The conductive liner is preferably conformal, and may comprise a single layer of Ta, TaN, WN, WSi, TiN, Ru and combinations thereof, as examples. The conductive liner is typically used as a barrier layer for preventing metal from diffusing into the underlying substrate 100 and the first insulating layer 110. These liners are deposited, for example, using a Chemical Vapor Deposition (CVD), Plasma Vapor Deposition (PVD) or Atomic Layer Deposition (ALD) process.

A conductive material 40 is then deposited similarly using, for example, a CVD, PVD or ALD process over the first insulating layer 110 to fill the contact plug hole. Excess portions of the conductive material 40 are removed from the top surface of the first insulating layer 110, e.g., using a chemical-mechanical polishing (CMP) process, thus forming the contact plugs 120. The conductive material preferably comprises W, although copper, aluminum, Al—Cu—Si, other metals and combinations thereof may also be used. If the conductive material 40 comprises W, preferably a bi-layer seed layer comprising CVD titanium nitride and silicon doped tungsten seeds are used. In some embodiments, the contact plug 120 is filled with copper, forgoing the titanium nitride liner which may be problematic in deeply scaled technologies.

Figure 6D:
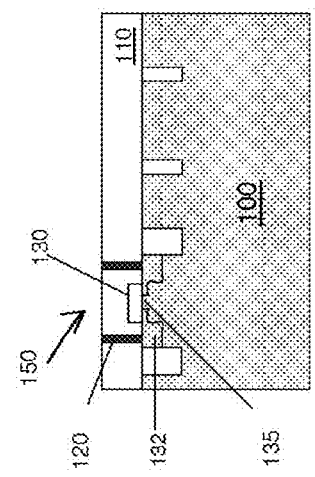

Referring to FIG. 6d, an opening 52 is formed inside the substrate 100 for forming the through substrate via and lined with a diffusion barrier material layer. A high density plasma process in an RF plasma chamber is used to form an opening 52 from the top surface of the substrate 100. In other embodiments, other types of reactive ion etch processes may be used, including processes using simultaneous bottom etch and sidewall passivation.

An insulating sidewall liner (not shown) is formed on the sidewalls of the opening. The insulating sidewall liner electrically insulates the active regions of the substrate 100 from the through substrate via 50. The insulating sidewall liner in various embodiments comprises multiple layers. The insulating sidewall liner may comprise silicon oxide, silicon nitride, silicon oxynitride, SiC, SiCN, a dense or porous low k or ultra low k dielectric material, an organic material or polymer like parylene, BCB, SiLK or others. In some embodiments, the insulating sidewall liner is anisotropically etched forming a sidewall spacer. Alternatively, outer dielectric liner is etched after the grinding and thinning processes that expose the bottom surface of the opening.

A conductive through substrate via liner 30 is deposited on the insulating sidewall liner. The conductive through substrate via liner 30 is ideally conformal or at least continuous, and may comprise a single layer or layer combination of Ta, TaN, W, WN, WCN, WSi, Ti, TiN, Ru as examples. The conductive through substrate via liner 30 is used, for example, as a barrier layer for preventing metal from diffusing into the underlying substrate 100. The conductive through substrate via liner 30 may also used for current conduction during a subsequent electroplating process.

The conductive through substrate via liner 30 is formed using a chemical vapor deposition process or a plasma enhanced CVD process or a combination of both, although in other embodiments, other processes may be used. In one embodiment, the conductive through substrate via liner 30 comprises a Ta/TaN layer. A 5-30 nm tantalum layer is deposited followed by a deposition of about a 20-100 nm TaN layer. An optional seed layer may be deposited over the conductive through substrate via liner 30.

Figure 6F:
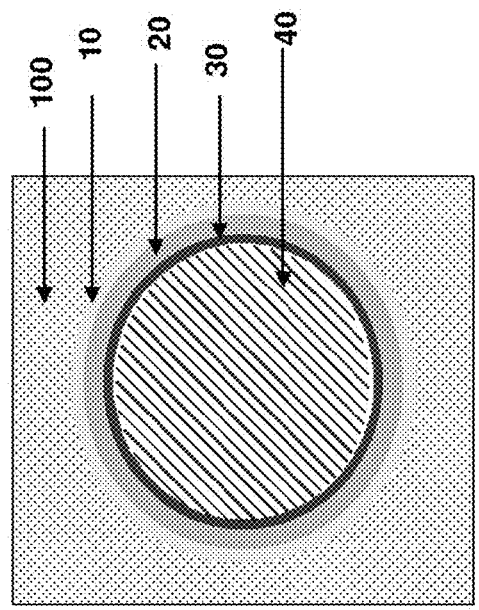
Figure 6E:
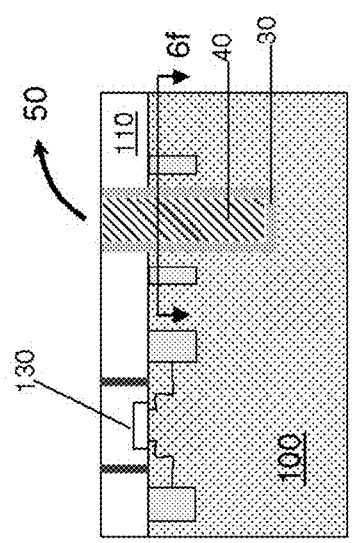

Referring to FIGS. 6e and 6f, a through substrate via 50 is formed between the stress barrier structure 10 by filling the opening 52 (of FIG. 6d) with a conductive material 40. The conductive material 40 is deposited into the opening 52 to form the through substrate via 50. In one embodiment, the conductive material 40 is electroplated. The conductive material 40 comprises a conductive material, such as copper or alternatively, aluminum, tungsten, silver, gold or doped polysilicon. In various embodiments, the conductive material 40 comprises copper.

While in this embodiment the through substrate via 50 is formed after the first insulating layer 110 is formed, in other embodiments the through substrate via 50 is formed at any suitable step in the fabrication process. For example, in some embodiments, the through substrate via 50 is formed after the completion of both the front end of the line and the back end of the line processing.

The top surface of the wafer is planarized to expose the first insulating layer 110 (as shown in FIG. 6e). In various embodiments, the planarization process comprises a chemical mechanical polishing (CMP). In various embodiments, the polishing process stops on the first insulating layer 110. A post CMP clean is next performed to remove any slurry residuals.

Subsequent processing continues as in conventional processing. As shown in FIG. 6g, metallization levels (ML) are fabricated over the first insulating layer 110. The metallization levels interconnect the various active components, as well as couple the through substrate via 50 to the active components (for example, to transistor 150). The metallization levels interconnect comprises metal lines interconnected by vias. The metal lines and vias within the metallization levels ML couple the through substrate via 50 to device regions 200. After forming the last metal level, a top bonding pad 160 is formed to couple the through substrate via 50 to external potentials.

Figure 6H:
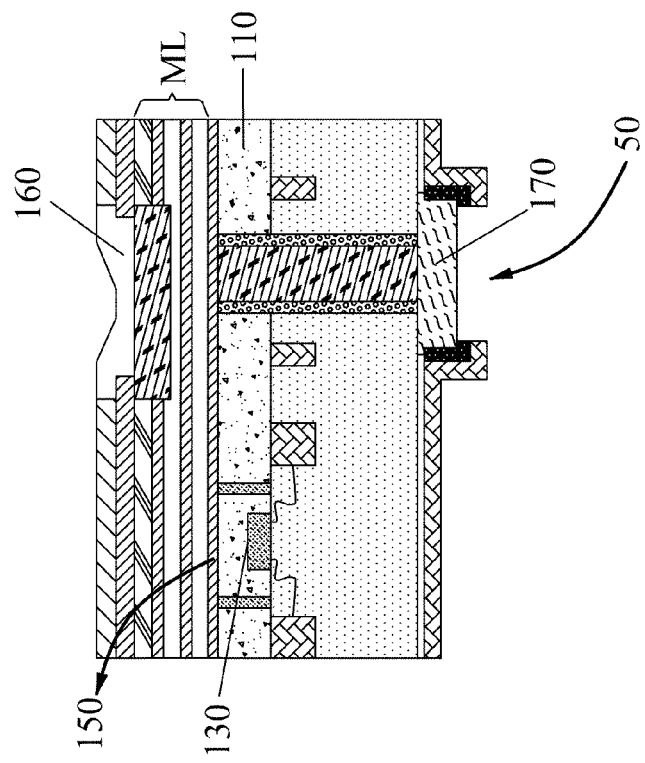
Figure 6G:
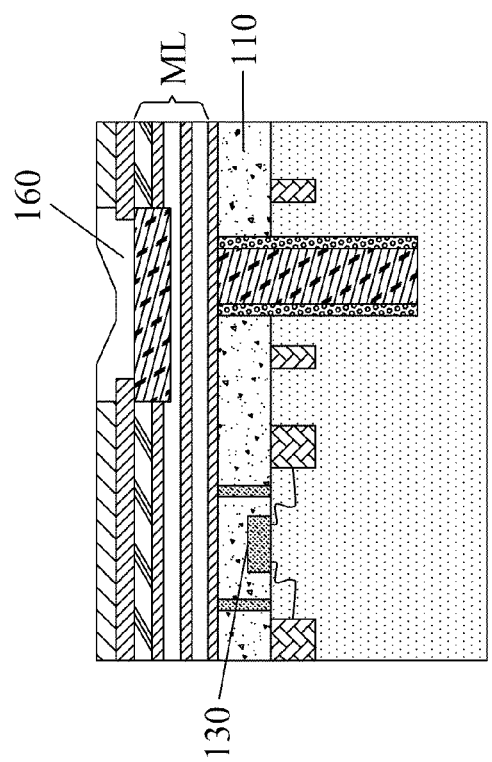

Referring to FIG. 6h, the substrate 100 is thinned from the back side, for example, by a combination of etching and grinding techniques. The thinning process exposes the conductive through substrate via liner 30 of the through substrate via 50. Appropriate back side contacts 170 are subsequently fabricated. In some embodiments, redistribution lines may be fabricated on the back surface coupled to back side contacts 170. The substrate 100 is diced to form individual chips.

In various embodiments, advantageously, the stress barrier structure 10 does not require additional silicon area. This is because the distance from through substrate via 50 to adjacent transistors (for example, transistor 150) is unaffected despite the introduction of the stress barrier structure 10 and the buffer structure 20.

Figure 7A:
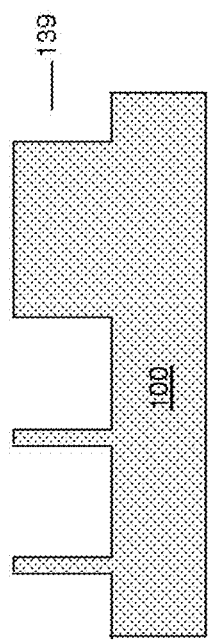
Figure 7B:
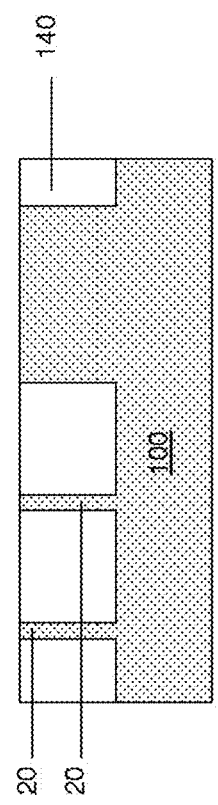
Figure 7E:
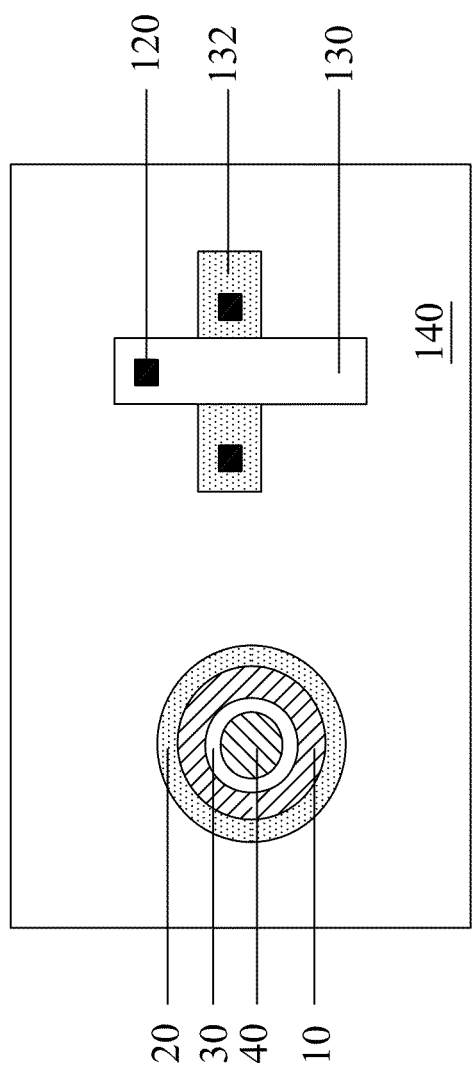
Figure 8:
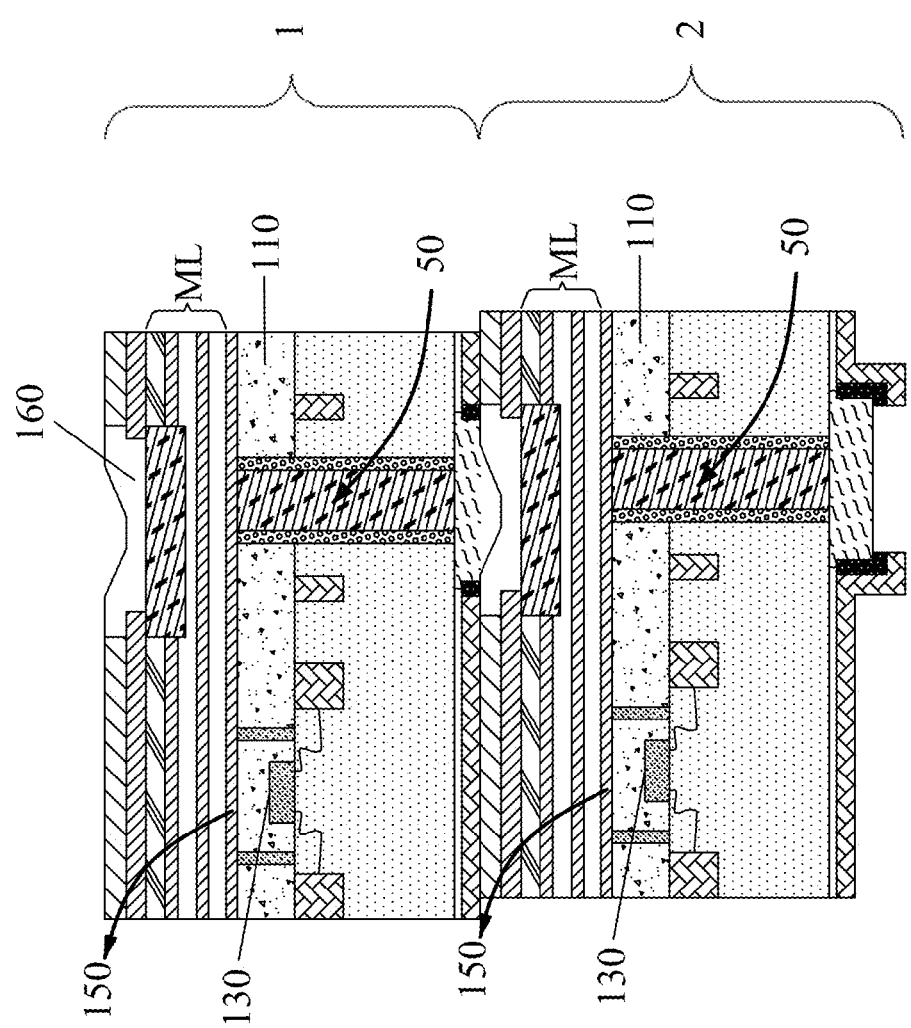
FIG. 8 illustrates an embodiment describing stacked chips with through substrate vias.

FIG. 7, which includes FIGS. 7a-7e, illustrates a method of fabrication of a through substrate via surrounded by the stress relaxation layers in accordance with embodiments of the invention.

As illustrated in FIG. 7a, trenches 139 for isolation regions are formed in a substrate 100 using conventional processing. The trenches 139 include the regions for forming through substrate conductors. Referring to FIG. 7b, the trenches 139 are filled with an insulating material to form isolation regions 140, as described with respect to FIG. 6a, defining active areas and buffer structure 20.

Referring to FIG. 7c, device regions 200 comprising a transistor 150 are formed on a side near a top surface of a substrate 100 during front end processing as also described in FIGS. 6b and 6c. The transistor 150 includes a channel 135 disposed between source/drain regions 132, and a gate stack comprising a gate electrode 130 disposed over the channel 135. The transistor 150 is coupled through contact plugs 120 through a first insulating layer 110.

A through substrate via 50 comprising a conductive material 40 and a through substrate via liner 30 is formed through the substrate 100 (FIG. 7d), as also described with respect to FIGS. 6d-6h. The top view of the structure at this stage of fabrication is illustrated in FIG. 7e. Subsequent processing continues as illustrated in the embodiment of FIG. 6

FIG. 8 illustrates an embodiment describing stacked chips with through substrate vias.

As illustrated in FIG. 8, a first chip 1 is stacked over a second chip 2 to form a stacked integrated circuit chip. The first chip 1 and/or the second chip 2 comprise a through substrate via along with the stress barrier structure as described in various embodiments. In FIG. 8, the first chip 1 and the second chip are stacked so that the back surface of the first chip 1 is attached to the top surface of the second chip. However, in alternative embodiments, the back surface of the first chip 1 may be attached to the back surface of the second chip 2.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   an active device region disposed between isolation regions in a first substrate;
   a through substrate via disposed within the first substrate, the through substrate via being disposed adjacent to the active device region;
   a stress barrier layer encircling the through substrate via, wherein the stress barrier layer and the isolation regions extend into the first substrate a substantially same depth; and
   a first portion of the first substrate separating the through substrate via from the stress barrier layer forming a buffer layer, the buffer layer surrounding the through substrate via.

2. The device of claim 1, wherein the stress barrier layer comprises oxide or nitride.

3. The device of claim 1, wherein the first substrate comprises a silicon substrate, and wherein the through substrate via comprises a conductive fill material.

4. The device of claim 3, wherein the conductive fill material is lined with a conductive liner, wherein the conductive liner comprises a material selected from the group consisting of titanium, tantalum, tungsten, tungsten carbide, ruthenium, nitrides thereof, and combinations thereof, and wherein the conductive fill comprises a material selected from the group consisting of copper, aluminum, polysilicon, and metal silicides.

5. The device of claim 1, wherein the buffer layer comprises a substantially concentric annular shape centered on a center of the through substrate via.

6. The device of claim 1, wherein a modulus of elasticity of the isolation regions is less than a modulus of elasticity of the buffer layer.

7. The device of claim 1, wherein the modulus of elasticity of the isolation regions is less than 75% of the modulus of elasticity of the buffer layer.

8. The device of claim 1, wherein the thickness of the buffer layer is at least greater than 1% of the diameter or width of the through substrate via.

9. The device of claim 1, further comprising:
a second substrate disposed under a bottom surface of the first substrate and comprising active devices disposed within another isolation regions;
another through substrate via disposed within the second substrate; and
another buffer layer surrounding the another through substrate via, the another isolation regions being separated from the through substrate via by the another buffer layer, wherein the through substrate via and the another through substrate via are coupled together.

10. The device of claim 9, wherein the another buffer layer within the second substrate and the second substrate comprise a same material, and wherein the another buffer layer comprise a substantially concentric annular shape centered on a center of the another through substrate via.

11. A semiconductor device comprising:
an active region disposed between isolation regions disposed within a first surface of a substrate;
a transistor disposed in the active region;
a through substrate via disposed within the substrate, the transistor being disposed adjacent the through substrate via;
an insulating layer surrounding the through substrate via, wherein the insulating layer and the isolation regions have a substantially same depth; and
a portion of the substrate extending to the first surface between the through substrate via and the insulating layer forming a buffer layer, the buffer layer encircling the through substrate via.

12. The device of claim 11, wherein the buffer layer comprises a substantially concentric annular shape centered on a center of the through substrate via.

13. The device of claim 11, wherein the buffer layer is disposed between the isolation regions and the through substrate via, the isolation regions being adjacent the transistor.

14. The semiconductor device of claim 11, wherein the isolation regions and the insulating layer have a same material composition.

15. A semiconductor device comprising:
an active device region surrounded by isolation regions in a substrate;
a through substrate via extending through the substrate, the through substrate via being disposed adjacent the active device region;
a portion of the substrate encircling the through substrate via forming a buffer layer; and
a stress alleviation layer encircling the buffer layer, the stress alleviation layer extending only into an upper portion of the substrate.

16. The semiconductor device of claim 15, wherein the substrate comprises a silicon substrate, wherein the stress alleviation layer comprises an oxide, and wherein the through substrate via comprises a conductive fill material.

17. The semiconductor device of claim 15, wherein the stress alleviation layer further comprises:
a liner material comprising a nitride; and
a filler material comprising an oxide.

18. The semiconductor device of claim 15, wherein the buffer layer and the stress alleviation layer comprise substantially concentric annular shapes centered on a center of the through substrate via.

19. The semiconductor device of claim 15 further comprising a transistor disposed in the active device region.

20. The semiconductor device of claim 15, wherein the wherein the isolation regions and the stress alleviation layer have a same material composition.

* * * * *

UNITED STATES PATENT AND TRADEMARK OFFICE
CERTIFICATE OF CORRECTION

| | | |
|---|---|---|
| PATENT NO. | : 8,704,375 B2 | Page 1 of 1 |
| APPLICATION NO. | : 12/613417 | |
| DATED | : April 22, 2014 | |
| INVENTOR(S) | : Liu et al. | |

It is certified that error appears in the above-identified patent and that said Letters Patent is hereby corrected as shown below:

In the Claims

In Col. 12, line 40, claim 20, delete "wherein the".

Signed and Sealed this
Twenty-ninth Day of July, 2014

Michelle K. Lee
*Deputy Director of the United States Patent and Trademark Office*